United States Patent
Onodera

(10) Patent No.: US 8,107,644 B2
(45) Date of Patent: Jan. 31, 2012

(54) AMPLIFYING ELEMENT AND MANUFACTURING METHOD THEREOF

(75) Inventor: Eio Onodera, Ota (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 416 days.

(21) Appl. No.: 12/410,105

(22) Filed: Mar. 24, 2009

(65) Prior Publication Data

US 2009/0245543 A1    Oct. 1, 2009

(30) Foreign Application Priority Data

Mar. 28, 2008 (JP) ................. 2008-086638

(51) Int. Cl.
*H04R 3/00* (2006.01)
(52) U.S. Cl. .............. 381/111; 381/120; 257/273
(58) Field of Classification Search .......... 381/111, 381/113, 120, 174, 176, 191, 369; 330/149, 330/300, 278; 257/271–273
See application file for complete search history.

(56) References Cited

U.S. PATENT DOCUMENTS

| 7,110,560 | B2* | 9/2006 | Stenberg ............ 381/113 |
| 7,569,906 | B2* | 8/2009 | Mori et al. ............ 257/522 |
| 2003/0122167 | A1 | 7/2003 | Okawa et al. |

FOREIGN PATENT DOCUMENTS

| JP | 5-167358 | 7/1993 |
| JP | 2003-243944 | 8/2003 |

\* cited by examiner

*Primary Examiner* — Hoai V Pham
(74) *Attorney, Agent, or Firm* — Morrison & Foerster LLP

(57) ABSTRACT

An amplifier integrated circuit element or J-FET is used for impedance conversion and amplification of ECM. The amplifier integrated circuit element has advantages of allowing an appropriate gain to be set by adjusting a circuit constant, and of producing a higher gain than the J-FET; but also has a problem of having a complicated circuit configuration and requiring high costs. Using only the J-FET has also problems of outputting a voltage insufficiently amplified and producing a low gain. Against this background, provided is a discrete element in which: a J-FET and a bipolar transistor are integrated on one chip; a source region of the J-FET is connected to a base region of the bipolar transistor; and a drain region of the J-FET is connected to a collector region of the bipolar transistor. Accordingly, an ECM amplifying element with high input impedance and low output impedance can be achieved.

10 Claims, 7 Drawing Sheets

$$Vin = \frac{Cm}{Cm+Cin}VAC$$

Prior Art

US 8,107,644 B2

AMPLIFYING ELEMENT AND MANUFACTURING METHOD THEREOF

This application claims priority from Japanese Patent Application Number JP2008-086638, filed on Mar. 28, 2008, the content of which is incorporated herein by reference in its entirety.

BACKGROUND OF THE INVENTION

1. Field of the Invention

The present invention relates to an amplifying element and a manufacturing method thereof, and particularly to an amplifying element that is preferably used for an amplifying device and a manufacturing method thereof.

2. Description of the Related Art

In order to perform impedance conversion and amplification of an electret condenser microphone (hereinafter referred to as ECM), a junction field effect transistor (hereinafter referred to as J-FET) or an amplifier integrated circuit element is used, for example (see Japanese Patent Application Publications Nos. 2003-243944 and Hei 5-167358, for example).

FIG. 11 is a circuit diagram showing a conventional ECM 115 and an amplifying element 110 to be connected thereto. One end of the ECM 115 is connected to a gate G of the J-FET 110 which is the amplifying element. One end of the J-FET 110 is grounded, while the other end thereof is connected to a load resistance RL. Since the ECM 115 has high output impedance, a weak output current is stored in the gate G of the J-FET 110 for impedance conversion and is inputted as an input voltage. The input voltage is amplified and then a drain current with low output impedance flows from the J-FET 110. The product of a change in the drain current and the load resistance RL is extracted as an AC component of an output voltage $V_{out}$. The sensitivity of a microphone for the ECM 115 is better as the AC component of the output voltage $V_{out}$ is larger.

In addition, in place of the above J-FET 110, an amplifier integrated circuit element using C-MOS or Bi-CMOS is also well-known (see, for example, Japanese Patent Application publication No. Hei 5-167358).

The amplifier integrated circuit element has advantages that an appropriate gain of the circuit element can be selectively set by adjusting a circuit constant, and that the amplifier integrated circuit element generally produces a higher gain than the J-FET. However, the amplifier integrated circuit element has a problem of having a complicated circuit configuration and of requiring high costs.

On the other hand, it is known that the J-FET has high input impedance, causes only a small amount of low-frequency noise for small signal amplification, and is excellent in a high-frequency characteristic. In addition, the J-FET has a simpler circuit configuration and requires lower cost than the amplifier integrated circuit element.

Since the amplifier integrated circuit element amplifies an input together with input noise, S/N, which is an index of sound quality, is not improved even when the gain is changed. Additionally, the noise is generated from each of resistances and semiconductors. For this reason, having a more complicated circuit configuration than the J-FET with a simple configuration, the amplifier integrated circuit element includes a larger number of noise resources, and accordingly has a lower S/N than the J-FET, in general. Accordingly, it is a common practice to use the amplifier integrated circuit element if high sensitivity is required to be achieved, but to use the J-FET if the required sensitivity is achievable by the J-FET.

However, there is a problem that the J-FET alone cannot sufficiently amplify an output, so that the resultant gain is low. As described above, the sensitivity of the ECM microphone is influenced by the AC component of the output voltage $V_{out}$ amplified by the amplifying element. Accordingly, a higher gain is desirable to improve the sensitivity of microphone.

In order to increase the gain, it is effective to increase the area (cell size) of the J-FET. However, the increase in the area of the J-FET leads to an increase in an input capacitance Cin of the J-FET.

FIG. 12 shows an equivalent circuit in an output unit of the ECM and an input unit of the J-FET. In FIG. 12, VAC is an AC output voltage at the time of releasing an output of the ECM, Cm is an internal capacitance of the ECM, and Cin is an input capacitance of the J-FET.

At this time, the output of the ECM is not released and Cin is in a loaded state. As expressed by the equation of Vin=Cm/(Cm+Cin)VAC, the input voltage Vin of the J-FET in this case becomes smaller as Cm becomes smaller or Cin becomes larger, thereby causing an input loss. Here, if the input loss is reduced, the gain can be increased. Accordingly, the increase of Cm in designing the ECM unit and the reduction of Cin in designing the amplifying element lead to an improvement in the gain.

However, in order to decrease the input capacitance Cin as described above, the area of the J-FET has to be reduced. In this case, the J-FET is capable of controlling only a reduced amount of current, thereby producing only a small gain. In other words, the gain and the input capacitance Cin have a trade-off relationship. Thus, the simple and reasonable amplifying element using the J-FET has a limitation in improving the gain.

SUMMARY OF THE INVENTION

The invention provides an amplifying element to be connected to an electret condenser microphone. The amplifying element includes a semiconductor substrate of a first general conductivity type, a semiconductor layer of the first general conductivity type formed on the semiconductor substrate, a junction field effect transistor formed on the semiconductor substrate and a bipolar transistor formed on the semiconductor substrate. The junction field effect transistor includes a back gate diffusion region of a second general conductivity type formed in the semiconductor layer, a back gate contact region of the second general conductivity type formed in the back gate diffusion region, a channel region of the first general conductivity type formed in the back gate diffusion region, a source region and a drain region of the first general conductivity type that are formed in the channel region, and a top gate region of the second general conductivity type formed in the channel region. The bipolar transistor uses the semiconductor substrate and the semiconductor layer as a collector region and includes a base region of the second general conductivity type formed in the semiconductor layer, and an emitter region of the first general conductivity type formed in the base region. The source region is electrically connected to the base region, and the drain region is electrically connected to the collector region.

The method also provides a method of manufacturing an amplifying element to be connected to an electret condenser microphone. The method includes forming a semiconductor layer of a first general conductivity type on a semiconductor substrate of the first general conductivity type, forming in the semiconductor layer a back gate diffusion region and a base region that are of a second general conductivity type, forming a channel region of the first general conductivity type in the back gate diffusion region and an emitter region of the first general conductivity type in the base region, forming a top gate region of the second general conductivity type in the channel region, forming in the channel region a source region and a drain region that are of the first general conductivity type, electrically connecting the source region and the base region, and electrically connecting the drain region and the collector region.

The invention further provides an electret condenser microphone system that includes an electret condenser microphone having a first terminal and a second terminal and an amplifying element including a semiconductor substrate, a junction field effect transistor formed on the semiconductor substrate and a bipolar transistor formed on the semiconductor substrate. The first terminal of the electret condenser microphone is connected to the gate of the junction filed effect transistor, the source of the junction field effect transistor is connected to the base of the bipolar transistor, and the drain of the junction filed effect transistor is connected to the collector of the bipolar transistor. The system also includes a load resistor connected to the collector of the bipolar transistor.

DESCRIPTION OF THE INVENTION

By referring to FIGS. 1 to 10, a preferred embodiment of the present invention will be described by taking, as an example, the case where an n channel type J-FET and an npn bipolar transistor are integrated on an n type semiconductor substrate.

Figure 1:
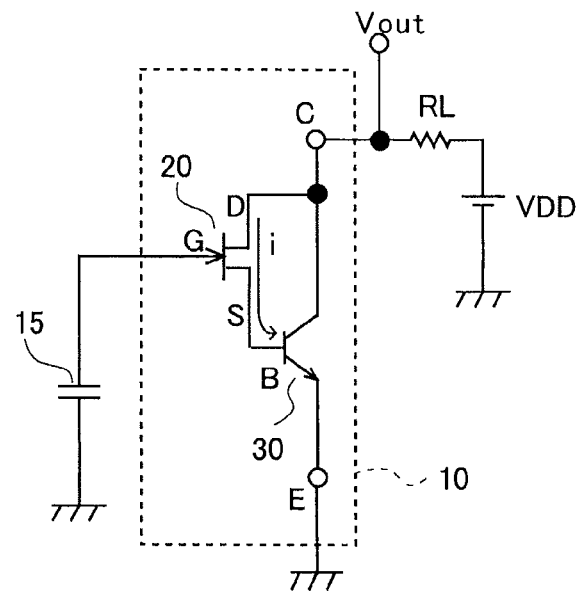
FIG. 1 is a circuit diagram for illustrating an amplifying element according to a preferred embodiment.

FIG. 1 is a circuit diagram showing a connection example of an amplifying element 10 according to the preferred embodiment.

The amplifying element 10 is an element that is connected to an electret condenser microphone (ECM) 15 so as to perform impedance conversion and amplification. In the amplifying element 10, a junction field effect transistor (J-FET) 20 and a bipolar transistor 30 are integrated on a one conductivity type semiconductor substrate.

The ECM 15 has a vibration film (diaphragm) and an electrode facing thereto, which are arranged in a casing, and takes movements of the vibration film generated by sounds as changes in capacitance between the vibrating film and the electrode. The vibration film is configured of, for example, a polymeric material, and is allowed by the electret effect to sustain electric charges.

The amplifying element 10 according to the embodiment is a discrete (discrete semiconductor) element in which the J-FET 20 and the bipolar transistor 30 are integrally mounted on one chip. The discrete (discrete semiconductor) element is also called an individual semiconductor and is a collective term for simple-function semiconductor elements. One end of the ECM 15 is connected to a gate of the J-FET 20. One end of the J-FET 20 (for example, a source S) is connected to a base B of the bipolar transistor 30 and the other end (for example, a drain D) of the J-FET 20 is connected to a collector C of the bipolar transistor 30. The collector C of the bipolar transistor 30 is connected to power source a VDD through a load resistance RL. An emitter E of the bipolar transistor 30 is grounded.

The operation of the amplifying element 10 is as follows.

When power is supplied from the collector of the bipolar transistor 30, a current i flows between the drain D and source S of the J-FET 20. A capacitance change (voltage change) of the ECM 15 is applied to the gate G of the J-FET 20 as a gate voltage, so that the current i flowing through the J-FET 20 is controlled according to an amount of the capacitance change. The current i according to the capacitance change flows from the source of the J-FET 20 to the base B of the bipolar transistor 30 and a current is supplied to the bipolar transistor 30. As a result, the current i is amplified by a current amplification factor $\beta$ ($=\Delta Ic/\Delta IB=hfe$) between the collector C and the emitter E. The result of the current amplification is converted to a voltage by the load resistance RL, and thus can be extracted from the collector C of the bipolar transistor 30 as an AC component of an output voltage $V_{out}$.

In general, the J-FET 20 has high input impedance. Accordingly, even if the flow of charges (current) according to the capacitance change of the ECM 15 is weak, the flow of charges can be extracted as a voltage change.

In addition to this, in the embodiment, the occupancy area (cell size) of the J-FET 20 on one chip is set to be small (for example, about a tenth part of the occupancy area (cell size) of the bipolar transistor 30). Accordingly, an input capacitance Cin of the J-FET 20 is sufficiently small.

Figure 12:
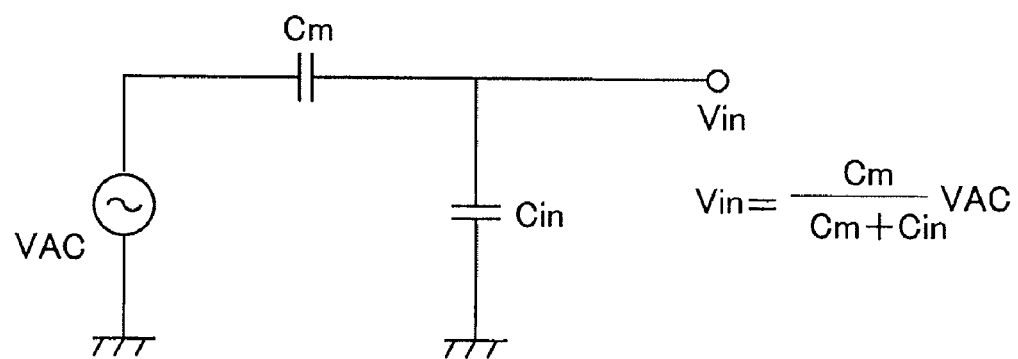
FIG. 12 is a circuit diagram for illustrating the conventional amplifying element.

Accordingly, an input loss in the J-FET 20 can be largely reduced in relation to the capacitance change output from the ECM 15 (see, FIG. 12).

On the other hand, when the cell size of the J-FET 20 is small, there is a problem that a gain becomes small. In the embodiment, however, an output current of the J-FET 20 can be amplified by the bipolar transistor 30. In other words, a desired gain can be secured by appropriately selecting the current amplification factor $\beta$ of the bipolar transistor 30.

As described above, the amplifying element 10 according to the embodiment can include the high input impedance by the J-FET 20 and the low output impedance by the bipolar transistor 30 at the same time. Accordingly, as compared with an amplifier integrated circuit element using BIP-LSI, C-MOS-LSI, or Bi-C-MOS-LSI, an amplifying element with a simple manufacturing process and lower cost can be provided.

In addition, the discrete element has an advantage that the number of noise sources is small because the circuit is simple and the cost is low.

Figure 2:
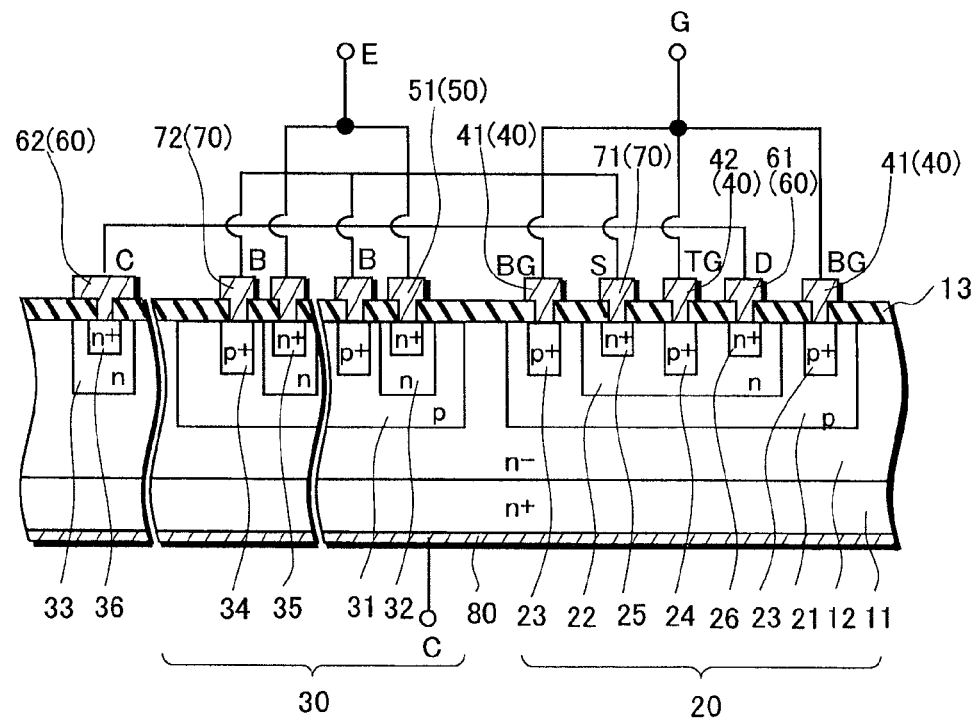
FIG. 2 is a cross-sectional view for illustrating the amplifying element according to the preferred embodiment.

By referring to FIG. 2, the structure of the amplifying element 10 will be described by using an n type substrate as an example. FIG. 2 is a schematic cross-sectional view of the amplifying element 10.

The amplifying element 10 is a discrete element in which the J-FET 20 and the bipolar transistor 30 are integrated on an n type substrate SB.

The substrate SB has an n− type semiconductor layer 12 laminated on a high concentration n type semiconductor substrate 11 serving as a collector region of the bipolar transistor 30.

The J-FET 20 includes a back gate diffusion region 21, a channel region 22, a back gate contact region 23, a top gate region 24, a source region 25, and a drain region 26.

The back gate diffusion region 21 is a p type impurity region provided in the surface of the n− type semiconductor layer 12. The channel region 22 is an n type impurity region provided in the surface of the back gate diffusion region 21. In the surface of the back gate diffusion region 21 outside the channel region 22, the back gate contact region 23, which is a high concentration p type impurity region, is provided. In the surface of the channel region 22, the top gate region 24, which is a high concentration p type impurity region, is provided, while the source region 25 and the drain region 26, which are high concentration n type impurity regions, are provided on both sides of the top gate region 24.

It is noted that conductivity types such as n+, n and n− belong in one general conductivity type and conductivity types such as p+, p and p− belong in another general conductivity type.

The bipolar transistor 30 is configured of a base region 31 and an emitter region 32 by using the substrate SB as a collector region.

The base region 31 is a p type impurity region provided in the surface of the n− type semiconductor layer 12. The emitter region 32 is an n type impurity region provided in the surface of the base region 31. In the surface of the emitter region 32, an emitter contact region 35, which is a high concentration type impurity region, is provided. In addition, a base contact region 34, which is a high concentration p type impurity region, is provided in the surface of the base region 31.

A collector extraction region 33 is an n type impurity region provided in the surface of the n− type semiconductor layer 12 with being spaced apart from the base region 31. The collector extraction region 33 is provided with an impurity concentration higher than that of the n− type semiconductor region 12 in order to extract a current of the substrate SB serving as a collector region. In the surface of the collector extraction region 33, a collector extraction contact region 36, which is further higher concentration n type impurity region, is provided.

It is preferable that the collector extraction region 33 be connected to n type semiconductor substrate 11.

On the surface of the substrate SB (the n− type semiconductor layer 12), a first electrode layer 40 forms a back gate electrode (BG) 41 and a top gate electrode (TG) 42, which are respectively connected to the back gate contact region 23 and the top gate region 24.

In addition, on the surface of the substrate SB (the n− type semiconductor layer 12), a second electrode layer 50 forms an emitter electrode (E) 51, which is connected to the emitter contact region 35.

Furthermore, on the surface of the substrate SB (the n− type semiconductor layer 12), a first wiring layer 60 forms a drain electrode (D) 61 and a collector wiring (C) 62 of the J-FET 20, which are respectively connected to the drain region 26 and the collector extraction contact region 36.

In addition, a second wiring layer 70 provided on the surface of the substrate SB forms a source electrode (S) 71 of the J-FET 20 and a base electrode (B) 72 of the bipolar transistor 30, which are respectively connected to the source region 25 and the base contact region 34.

On the back surface of the substrate SB, the third electrode layer forms a back surface collector electrode (C) 80.

Figure 3:
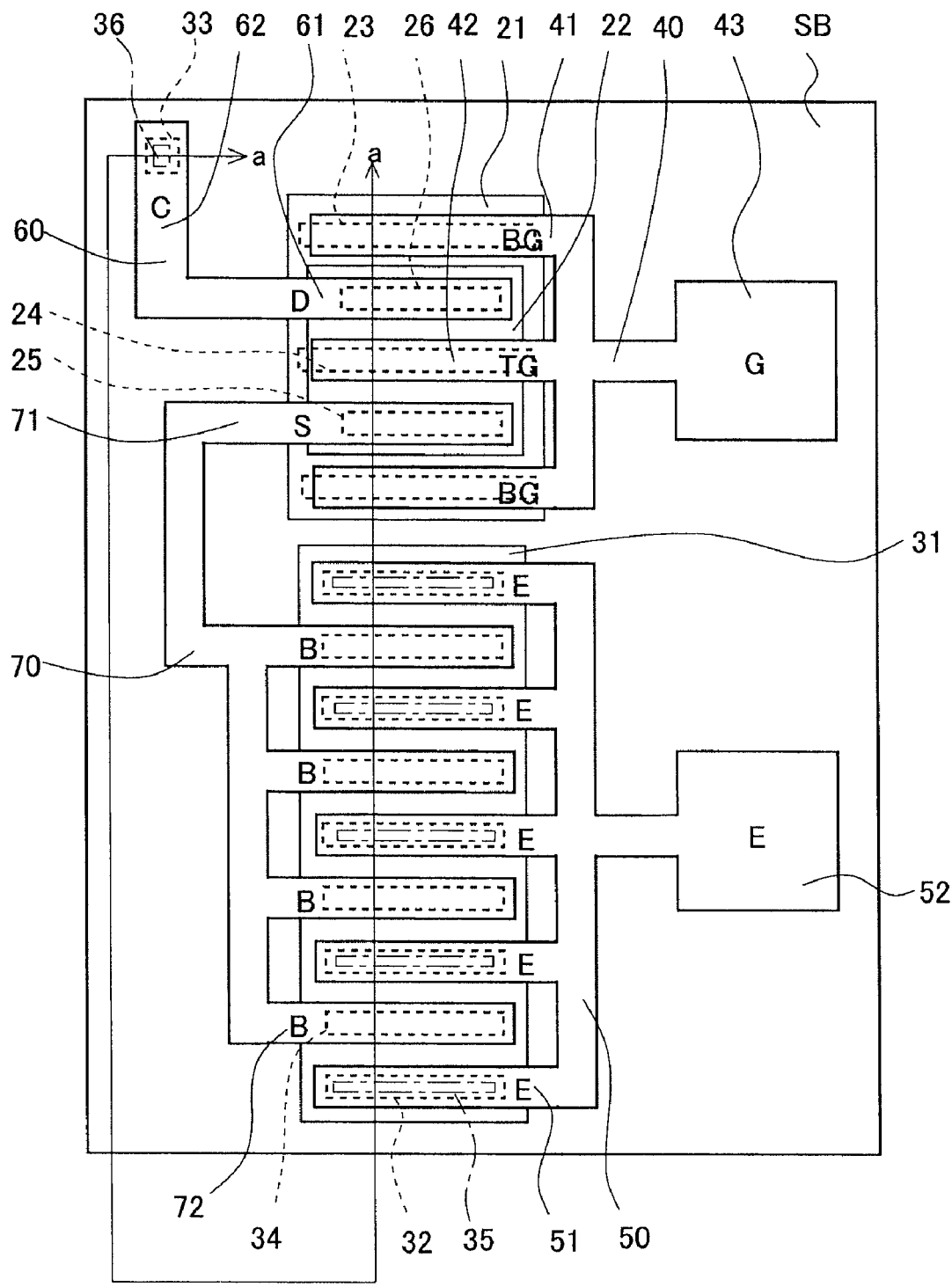
FIG. 3 is a plan view for illustrating the amplifying element according to the preferred embodiment.

FIG. 3 is a plan view showing the patterns of the first and second electrode layers and the first and second wiring layers. The cross-sectional view taken along the a-a line in FIG. 3 corresponds to the cross-sectional view in FIG. 2.

The first electrode layer 40 constitutes the comb-shaped back gate electrode 41, the top gate electrode 42, and a gate pad electrode 43. The back gate electrode 41 and the top gate electrode 42 are respectively superimposedly disposed on the back gate contact region 23 and the top gate region 24.

The second electrode layer 50 constitutes the comb-shaped emitter electrode 51 and an emitter pad electrode 52. The emitter electrode 51 is superimposedly disposed on the emitter region 32 (the emitter contact region 35).

The first wiring layer 60 constitutes the drain electrode 61 and the collector wiring 62. One end of the first wiring layer 60 is superimposedly disposed on the drain region 26 as the drain electrode 61 and the other end thereof is disposed on the collector extraction region 33 (the collector extraction contact region 36) as the collector wiring 62.

The second wiring layer 70 constitutes the source electrode 71 and the base electrode 72. The base electrode 72 is patterned in a comb shape. The source electrode 71 and the base electrode 72 are respectively superimposedly disposed on the source region 25 and the base region 31 (the base contact region 34).

Each of the drain electrode 61 and the source electrode 71 is disposed between the comb-shaped teeth of the back gate electrode 41 and the top gate electrode 42. The base electrode 72 and the emitter electrode 51 are disposed in such a shape that the comb-shaped teeth thereof would be engaged with each other.

With this configuration, the source region 25 of the J-FET 20 and the base region 31 of the bipolar transistor 30 are electrically connected to each other. Accordingly, configured is the one-chip amplifying element 10 in which the drain region 26 of the J-FET 20 and the collector region (the collector extraction contact region 36) of the bipolar transistor 30 are electrically connected to each other (see FIG. 2).

The amplifying element 10 according to the embodiment has the occupancy area (cell size) of the J-FET 20 on one chip, which is smaller than the occupancy area (cell size) of the bipolar transistor 30. The ratio of the areas of the J-FET 20 to the bipolar transistor 30 is, for example, 1 to 10 or larger.

FIG. 3 shows the case where the J-FET 20 has one minimum unit cell configured of one pair of the source region 25, the top gate region 24, and the drain region 26 (the number of each region is one). In this manner, one cell is sufficient for the J-FET 20, and the input capacitance Cin according to the decrease in the cell size can be minimized.

In contrast, the bipolar transistor 30 has 10 or more of minimum unit cells, each configured of one pair of the base region 31 and the emitter region 32. The current amplification factor β of the bipolar transistor 30 can be appropriately selected according to a forming condition of the emitter region 32. By appropriately selecting the current amplification factor β, the output current can be sufficiently amplified even in a case where the J-FET 20 having the cell size minimized to reduce the input capacitance Cin is adapted.

Figure 11:
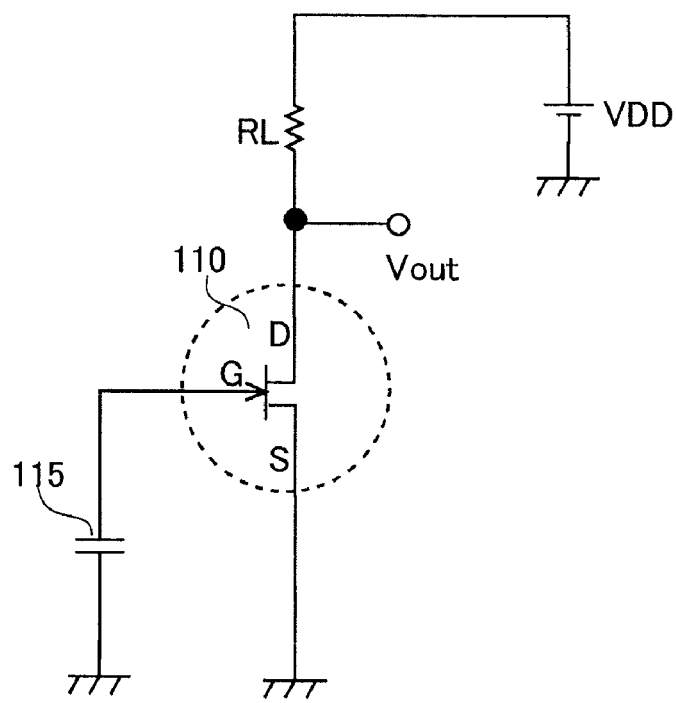
FIG. 11 is a circuit diagram for illustrating a conventional amplifying element.

Furthermore, the amplifying element 10 according to the embodiment has an advantage that an electrostatic breakdown tolerance is higher than that of an amplifying element using only a conventional J-FET. As compared with the J-FET 20 with a horizontal current path, the bipolar transistor 30 with a vertical current path has a larger area. Accordingly, when a current starts flowing through the J-FET 20 by the applied static electricity, a large current flows through the bipolar transistor 30, and the electrostatic current is extracted. Thus, as compared with the conventional structure shown in FIG. 11, the electrostatic breakdown tolerance can be improved.

By referring to FIGS. 4 to 9, a manufacturing method of an amplifying element according to the embodiment will be described.

Figure 4:
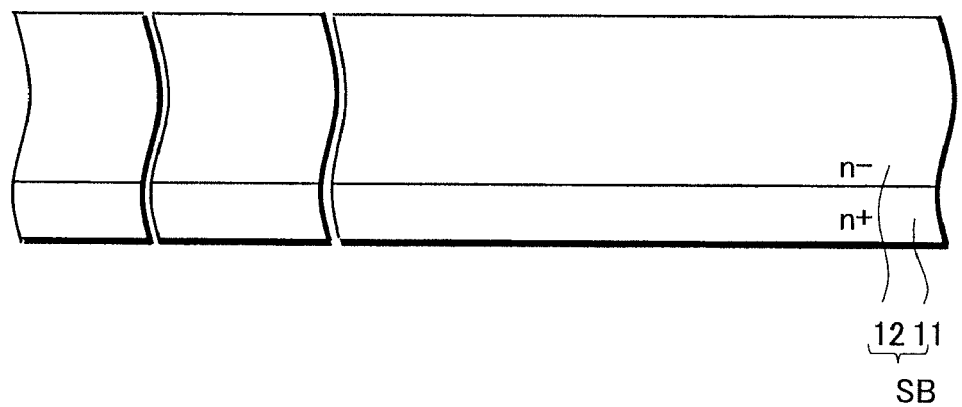
FIG. 4 is a cross-sectional view for illustrating a method of manufacturing an amplifying element according to the preferred embodiment.

The First Step (FIG. 4)

Prepared is the substrate SB in which the n− type semiconductor layer 12 (impurity concentration: for example, approximately $5E15\ cm^{-3}$) is laminated on the high concentration n type silicon semiconductor substrate 11 (impurity concentration: for example, approximately $5E19\ cm^{-3}$). The substrate SB constitutes one chip of a discrete semiconductor element.

Figure 5:
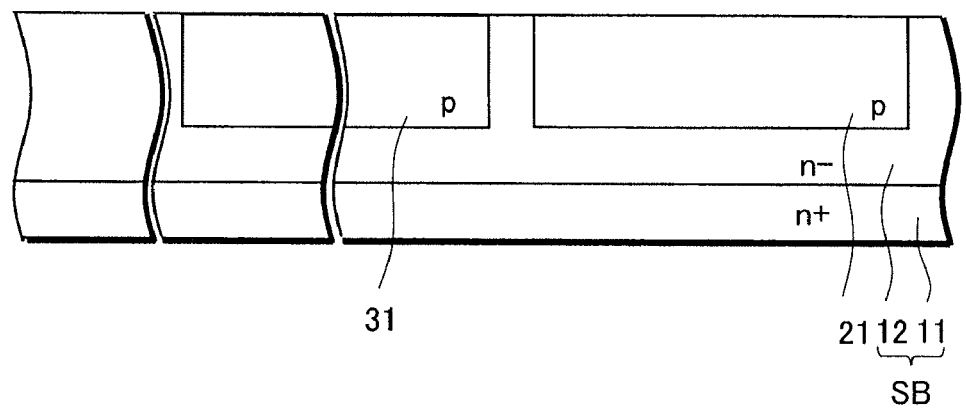
FIG. 5 is a cross-sectional view for illustrating the method of manufacturing an amplifying element according to the preferred embodiment.

The Second Step (FIG. 5)

Provided is a mask (unillustrated) in which the forming region of the back gate diffusion region and the forming region of the base region are opened in the surface of the n− type semiconductor layer 12. Thereafter, a p type impurity (for example, boron (B)) is ion-implanted and is then simultaneously diffused by a heat treatment (for example, at approximately 1100° C. for 300 minutes). As a result, the back gate diffusion region 21 and the base region 31 are formed to have an impurity concentration of, for example, approximately $1E16\ cm^{-3}$. Here, the back gate diffusion region 21 and the base region 31 are formed in the same depth.

Figure 6:
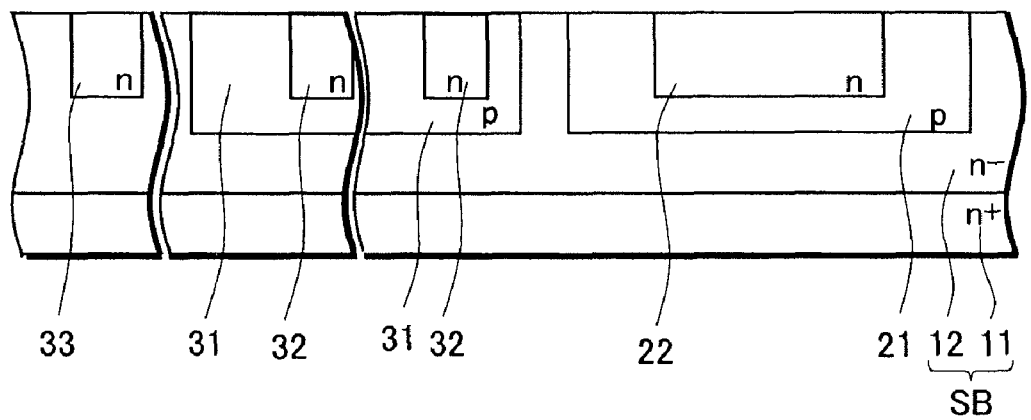
FIG. 6 is a cross-sectional view for illustrating the method of manufacturing an amplifying element according to the preferred embodiment.

The Third Step (FIG. 6)

Provided is a new mask (unillustrated) in which the respective forming regions of the channel region, the emitter region, the collector extraction region are opened in the surface of the n− type semiconductor layer 12. Thereafter, an n type impurity (for example, phosphorus (P)) is ion-implanted and is then simultaneously diffused by a heat treatment (for example, at approximately 1100° C. for 420 minutes).

As a result, the channel region 22 is formed in the surface of the back gate diffusion region 21, while the emitter region 32 is formed in the surface of the base region 31. In addition, the collector extraction region 33 is formed in the surface of the n− type semiconductor layer 12. The collector extraction region 33 is provided to be spaced apart from the base region 31 (see FIG. 2). The channel region 22, the emitter region 32, and the collector extraction region 33 have an impurity concentration of, for example, approximately $1E16\ cm^{-3}$, and are formed in the same depth.

Figure 7:
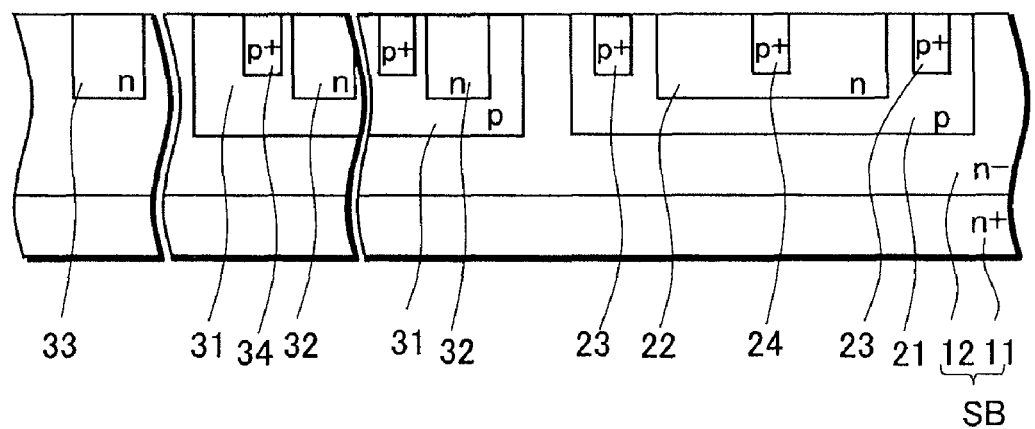
FIG. 7 is a cross-sectional view for illustrating the method of manufacturing an amplifying element according to the preferred embodiment.

The Fourth Step (FIG. 7)

Provided is a new mask (unillustrated) in which each of the forming regions of the top gate region, the back gate contact region, and the base contact region are opened in the surface of the n− type semiconductor layer 12. Thereafter, a p type impurity (for example, boron (B)) is ion-implanted and is then simultaneously diffused by a heat treatment (for example, at approximately 1100° C. for 30 minutes).

As a result, the top gate region 24 having an impurity concentration of, for example, approximately $1E19\ cm^{-3}$ is formed in the surface of the channel region 22. At the same time, the back gate contact region 23 is formed in the surface of the back gate diffusion region 21, while the base contact region 34 is formed in the surface of the base region 31.

The top gate region 24, the back gate contact region 23, the base contact region 34 are formed in the same depth.

Figure 8:
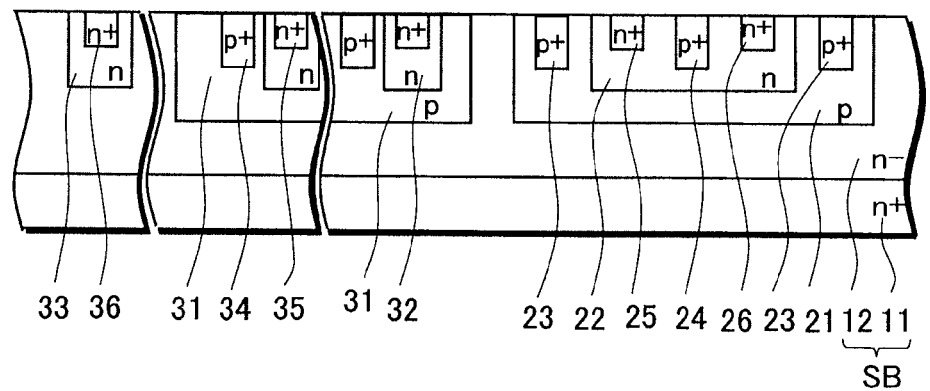
FIG. 8 is a cross-sectional view for illustrating the method of manufacturing an amplifying element according to the preferred embodiment.

The Fifth Step (FIG. 8)

Provided is a new mask (unillustrated) in which the respective forming regions of the source and drain regions, the emitter contact region, and the collector extraction contact region are opened in the surface of the n− type semiconductor layer 12. Thereafter, an n type impurity (for example, phosphorus (P)) is ion-implanted and is then simultaneously diffused by a heat treatment (for example, at approximately 1000° C. for 60 minutes).

As a result, the source region 25 and the drain region 26 are formed in the surface of the channel region 22. At the same time, the emitter contact region 35 is formed in the surface of the emitter region 32, while the collector extraction contact region 36 is formed in the surface of the collector extraction region 33.

All of the source region 25, the drain region 26, the emitter contact region 35, and the collector extraction contact region 36 have an impurity concentration of approximately $1E20\ cm^{-3}$, and are formed in the same depth.

In the J-FET 20, one pair of the source region 25, the drain region 26, and the top gate region 24 are formed in a strip shape in one back gate diffusion region 21. In the bipolar transistor 30, the multiple emitter regions 32 (the emitter contact regions 35) are formed in a strip shape in one base region 31. The ratio of the occupancy area of the J-FET 20 to the occupancy area of the bipolar transistor 30 is, for example, 1 to 10. It should be noted that the occupancy areas respectively mean here the areas of the back gate diffusion region 21 and the base region 31.

Note that, the order of the fourth step (FIG. 7) and the fifth step (FIG. 8) can be interchanged.

In addition, in the fourth and fifth steps, provided is a mask in which the respective forming regions of the top gate region, the back gate contact region, and the base contact region are opened in the surface of the n− type semiconductor layer 12. Thereafter, a p type impurity is ion implanted. After that, provided anew is a mask in which the respective forming regions of the source region, the drain region, the emitter contact region, and the collector extraction contact region are opened. Thereafter, an n type impurity is ion implanted. After that, the p type impurity and the n type impurity are simultaneously diffused by a heat treatment. In this manner, the top gate region 24, the back gate contact region 23, the base contact region 34, the source region 25, the drain region 26, the emitter contact region 35, and the collector extraction contact region 36 can be simultaneously formed.

Figure 9:
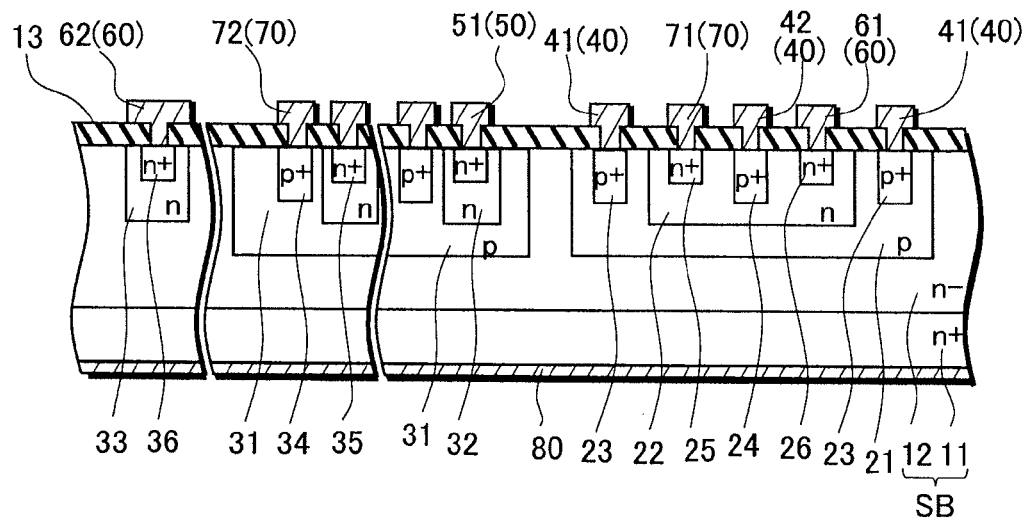
FIG. 9 is a cross-sectional view for illustrating the method of manufacturing an amplifying element according to the preferred embodiment.

The Sixth and Seventh Steps (FIG. 9)

Insulating film 13 is provided on the n− type semiconductor layer 12 and desired positions therein are opened. For example, the first electrode layer 40, the second electrode layer 50, the first wiring layer 60, and the second wiring layer 70 are formed of, for example, aluminum (Al).

The first electrode layer 40 forms the back gate electrode 41 and the top gate electrode 42, which are respectively connected to the back gate contact region 23 and the top gate region 24. In addition, the first electrode layer 40 forms the gate pad electrode 43 (see FIG. 3) outside the back gate diffusion region 21 of J-FET 20.

The second electrode layer 50 forms the emitter electrode 51 to be connected to the emitter contact region 35, and forms the emitter pad electrode 52 (see FIG. 3) outside the base region 31 of the bipolar transistor 30.

One end of the first wiring layer 60 becomes the drain electrode 61 while the other end thereof becomes the collector wiring 62, which are respectively connected to the drain region 26 and the collector extraction contact region 36.

The second wiring layer 70 forms the source electrode 71 and the base electrode 72, which are respectively connected to the source region 25 and the base contact region 34.

As a result, the source region 25 and the base region 31 are electrically connected to each other, while the drain region 26 and the collector extraction region 33 are electrically connected to each other.

The back surface collector electrode 80 is formed by metal deposition or the like on the back surface of the n+ type semiconductor substrate 11.

The collector extraction region 33 is preferable when connected to the n type semiconductor substrate 11. However, this increases the number of the manufacturing steps.

As described above, the description has been given of the case where an n channel type J-FET 20 and a npn bipolar transistor are integrated on an n type semiconductor substrate SB. However, the preferred embodiment of the present invention can be equally implemented even when the conductive type is reversed.

Figure 10:
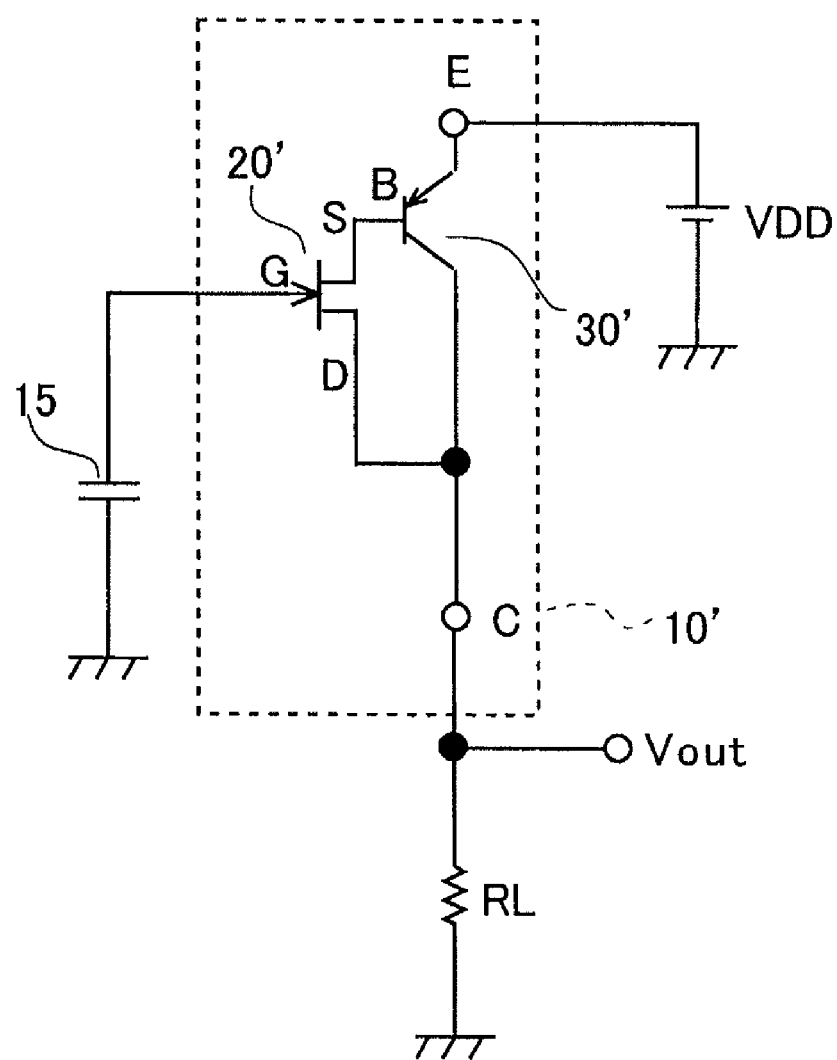
FIG. 10 is a circuit diagram for illustrating the amplifying element according to the preferred embodiment.

FIG. 10 is a circuit diagram of an amplifying element 10' in a case where a p channel type J-FET 20' and a pnp bipolar transistor 30' are integrated on a p type semiconductor substrate.

According to the present invention, an ECM amplifying element with high input impedance and low output impedance can be firstly achieved by a one chip discrete element in which the drain region of the J-FET is connected to the collector region of the bipolar transistor.

The amplifying element according to the present invention is configured by integrating the J-FET on the n type semiconductor substrate serving as the collector region of the bipolar transistor. The amplifying element has the configuration in which the source region of the J-FET is connected to the base region of the bipolar transistor, while the drain region of the J-FET is connected to the collector region of the bipolar transistor. Accordingly, a voltage output from the ECM is input to the gate of the J-FET with high impedance. This voltage change controls the current flowing through the J-FET. The current flowing through the J-FET is input to the bipolar transistor, and is output after the current (voltage) is amplified.

In other words, since the output of the J-FET can be amplified by the bipolar transistor, a sufficient output can be obtained even when the area (cell size) of the J-FET is decreased. For example, the J-FET may be one cell, and the input capacitance Cin can be made extremely small by reducing the cell size.

Accordingly, the required gain can be secured by the amplification factor of the bipolar transistor. Thus, the amplifying element with less input loss and high gain can be provided.

Secondly, the present invention can provide an amplifying element that is a one chip discrete element in which the J-FET is formed on a substrate serving as the collector region of the bipolar transistor, and that is inexpensive and simpler as compared with an amplifier integrated circuit element using BIP-LSI, C-MOS-LSI, or Bi-C-MOS-LSI.

Thirdly, the amplification factor of the amplifying element can be appropriately selected according to the amplification factor of the bipolar transistor.

The manufacturing method according to the present invention can integrate the bipolar transistor on the same substrate by adding only one step to the manufacturing steps of the J-FET, and thus can provide an inexpensive method of manufacturing an amplifying element.

Furthermore, the amplifying element according to the preferred embodiment of the invention has an advantage that electrostatic breakdown tolerance is higher than that of the amplifying element using only the conventional J-FET. If the area of the bipolar transistor is larger than that of the J-FET and when a current starts flowing through the J-FET by the applied electrostatic electricity, a large current flows through the bipolar transistor and the electrostatic current is extracted. Accordingly, the electrostatic breakdown tolerance can be improved as compared with the case having the conventional configuration.

What is claimed is:

1. An amplifying element to be connected to an electret condenser microphone, comprising:
    a semiconductor substrate of a first general conductivity type;
    a semiconductor layer of the first general conductivity type formed on the semiconductor substrate;
    a junction field effect transistor formed on the semiconductor substrate and comprising a back gate diffusion region of a second general conductivity type formed in the semiconductor layer, a back gate contact region of the second general conductivity type formed in the back gate diffusion region, a channel region of the first general conductivity type formed in the back gate diffusion region, a source region and a drain region of the first general conductivity type that are formed in the channel region, and a top gate region of the second general conductivity type formed in the channel region; and
    a bipolar transistor formed on the semiconductor substrate, using the semiconductor substrate and the semiconductor layer as a collector region and comprising a base region of the second general conductivity type formed in the semiconductor layer, and an emitter region of the first general conductivity type formed in the base region,
    wherein the source region is electrically connected to the base region, and the drain region is electrically connected to the collector region.

2. The amplifying element of claim 1, wherein an area occupied by the junction field effect transistor is smaller than an area occupied by the bipolar transistor.

3. The amplifying element of claim 2, wherein the area occupied by the junction field effect transistor is smaller than the area occupied by the bipolar transistor by at least a ratio of 1 to 10.

4. The amplifying element of claim 1, wherein the junction field effect transistor comprises only one pair of the source region and the drain region.

5. The amplifying element of claim 1, further comprising a first electrode layer in contact with the back gate contact region and the top gate region, a second electrode layer in contact with the emitter region and a third electrode layer formed on a back surface of the semiconductor substrate.

6. The amplifying element of claim 1, further comprising a collector extraction region of the first general conductivity type formed in the semiconductor layer, and a collector extraction contact region of the first general conductivity type formed in the collector extraction region.

7. The amplifying element of claim 6, further comprising a first wiring layer in contact with the drain region and the collector extraction contact region, and a second wiring layer in contact with the source region and the base region.

8. An electret condenser microphone system comprising:
- an electret condenser microphone comprising a first terminal and a second terminal;
- an amplifying element comprising a semiconductor substrate, a junction field effect transistor formed on the semiconductor substrate and a bipolar transistor formed on the semiconductor substrate, the first terminal of the electret condenser microphone being connected to a gate of the junction filed effect transistor, a source of the junction field effect transistor being connected to a base of the bipolar transistor, and a drain of the junction filed effect transistor being connected to a collector of the bipolar transistor; and
- a load resistor connected to the collector of the bipolar transistor.

9. The electret condenser microphone system of claim 8, wherein the second terminal of the electret condenser microphone and an emitter of the bipolar transistor are connected to a reference voltage.

10. The electret condenser microphone system of claim 8, wherein the second terminal of the electret condenser microphone is connected to a reference voltage, and an emitter of the bipolar transistor is connected to a power source.

* * * * *